(12) United States Patent
Ono (10) Patent No.: US 6,788,992 B2
(45) Date of Patent: Sep. 7, 2004

(54) CONTROL DEVICE FOR EMERGENCY STOP IN SEMICONDUCTOR MANUFACTURING SYSTEM

(75) Inventor: Akira Ono, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/338,911

(22) Filed: Jan. 9, 2003

(65) Prior Publication Data

US 2003/0236587 A1 Dec. 25, 2003

(30) Foreign Application Priority Data

Jun. 25, 2002 (JP) ........................................ 2002-184734

(51) Int. Cl.⁷ .............................................. G06F 19/00
(52) U.S. Cl. ...................................... 700/121; 700/249
(58) Field of Search ......................... 700/118–121, 123, 700/217, 228, 245–249, 255, 257, 258

(56) References Cited

U.S. PATENT DOCUMENTS

| | | | | |
|---|---|---|---|---|
| 6,065,128 A | * | 5/2000 | Harvey ........................ | 713/500 |
| 6,086,676 A | * | 7/2000 | Kao et al. .................... | 118/695 |
| 2003/0149506 A1 | * | 8/2003 | Haanstra et al. ............ | 700/121 |

OTHER PUBLICATIONS

Mano, "Digital Design" 1991, Prentice Hall, 2$^{nd}$ edition, pp. 58, 59, 65, 126, 202, 203, 204, 208, 209, 224, and 225.*
"SEMI E23–96 Specification for Cassette Transfer Parallel I/O Interface", Book of SEMI Standards 2001, Semiconductor Equipment and Material International, pp. 251–261.
"SEMI E–84–0999 Specification for Enhanced Carrier Handoff Parallel I/O Interface", SEMI 300mm Standards Update 1999, vol. 2, Semiconductor Equipment and Materials International, Nov. 1999, pp. 447–467.

* cited by examiner

Primary Examiner—Leo Picard
Assistant Examiner—Sean Shechtman
(74) Attorney, Agent, or Firm—McDermott Will & Emery LLP (57) ABSTRACT

The semiconductor manufacturing system includes semiconductor production equipment as the passive equipment and an AMHS as the active equipment. The semiconductor production equipment control panel includes a circuit which turns off an ES signal being applied via an optical I/O to the AMHS in response to an input from an ES button, without stopping the operation of the semiconductor production equipment. The AMHS includes a circuit which brings a vehicle and a hand of the AMHS to an emergency stop when the ES signal received via the optical I/O turns off.

5 Claims, 11 Drawing Sheets

CONTROL DEVICE FOR EMERGENCY STOP IN SEMICONDUCTOR MANUFACTURING SYSTEM

BACKGROUND OF THE INVENTION

1. Field of the Invention

The present invention relates to semiconductor manufacturing systems, and more particularly to a control device employing a standardized communication input/output (I/O) interface between semiconductor production equipment and transport equipment.

2. Description of the Background Art

The Semiconductor Equipment and Material International (SEMI) has laid down international standards for the purposes of reducing time and cost and restricting personnel expenditure on equipment development and factory startup in the semiconductor manufacturing processes. Among them, there are SEMI E84 Specification for Enhanced Carrier Handoff Parallel I/O Interface for 300 mm wafer carriers, and SEMI E23-Specification for Cassette Transfer Parallel I/O Interface for 200 mm wafer carriers. The E84 specification is for handoffs (load/unload) of the 300 mm wafer carriers between production equipment load ports and automated material handling systems (AMHS).

In the E84 specification, an emergency stop (ES) signal is defined as follows. When the ES signal is off, it requires active equipment (the AMHS) to immediately stop the action. Passive equipment (semiconductor production equipment) turns off the ES signal in an emergency situation, i.e., when "handoff interlock abnormal" or the like has occurred and an ES button is depressed. The ES signal is employed solely for such specific applications. Other comparable signals have not been defined.

Figure 1:
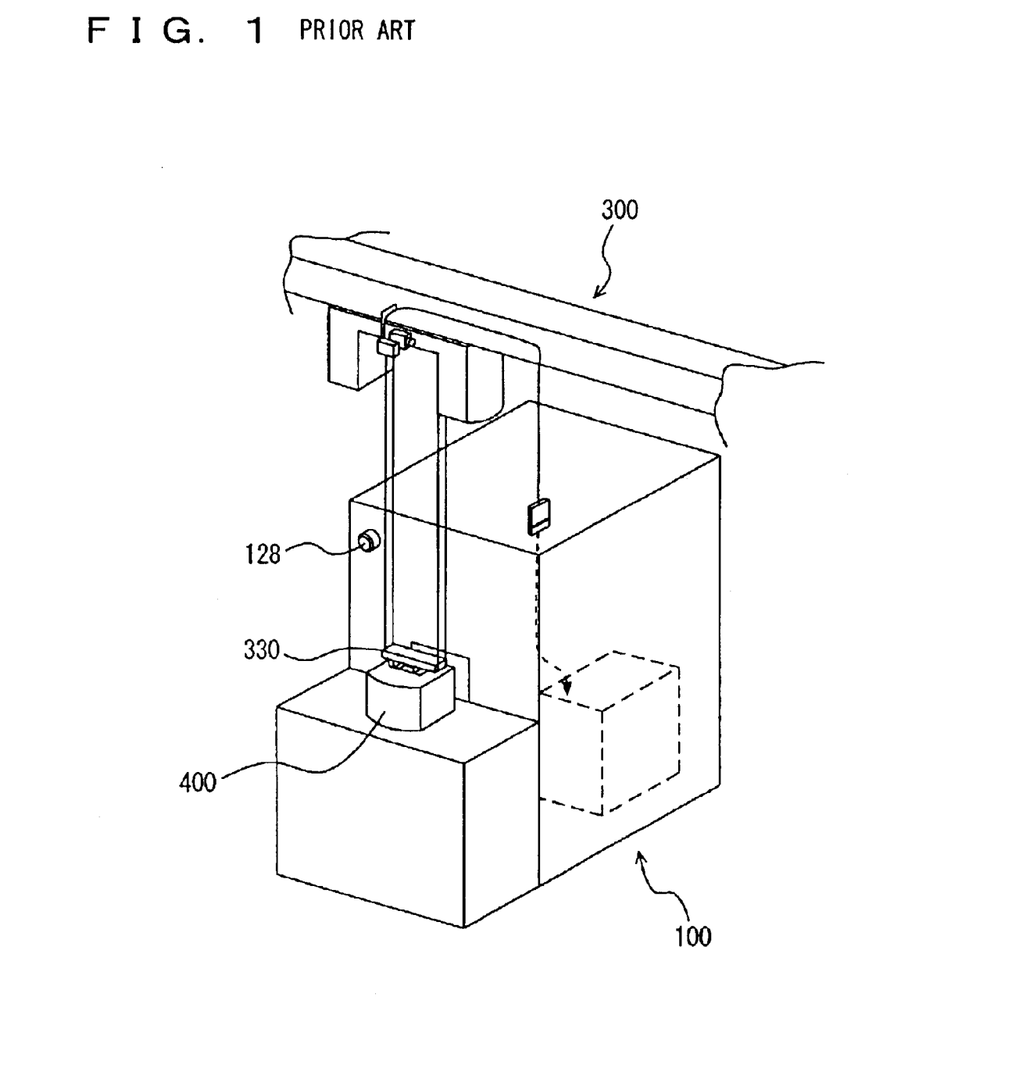
FIG. 1 is an external view of a conventional semiconductor manufacturing system.

Referring to FIG. 1, a conventional system which brings the AMHS to an emergency stop by the ES signal based on SEMI E84 is described. As shown in FIG. 1, the system includes semiconductor production equipment 100, an AMHS 300 which grips a carrier 400 with a hand 330 to transport wafers to semiconductor production equipment 100, and an emergency stop button 128. In general, semiconductor production equipment 100 and AMHS 300 are manufactured by separate manufacturers and installed in a semiconductor manufacturing factory. Semiconductor production equipment 100 is provided with a controller (programmable controller, sequencer or the like) for control of semiconductor production equipment 100, and AMHS 300 is provided with a controller (programmable controller, sequencer or the like) for control of AMHS 300. Communication between the controller of semiconductor production equipment 100 and the controller of AMHS 300 is defined based on SEMI E84.

Emergency stop button 128 is depressed by an operator when an error has occurred in semiconductor production equipment 100 or an emergency stop of AMHS 300 is required. In response to the depression of emergency stop button 128, the controller of semiconductor production equipment 100 urgently stops semiconductor production equipment 100 itself, and also turns off the ES signal (which is on in a normal state). When the controller of AMHS 300 detects turning off of the ES signal, it stops the motion of AMHS 300.

As such, according to the conventional semiconductor manufacturing system, when emergency stop button 128 is depressed to bring AMHS 300 to an emergency stop, not only the movement of AMHS 300 but also the movement of semiconductor production equipment 100 would be stopped immediately, regardless of whether there is a problem in semiconductor production equipment 100. In such a case, processing on the wafers in progress in semiconductor production equipment 100 is suspended even if there is no error occurring in the device, which hinders shipping of the wafers as the finished products, thereby degrading the yield.

SUMMARY OF THE INVENTION

An object of the present invention is to provide, in a semiconductor manufacturing system designed based on SEMI E84, E23 or the like, a control device of the semiconductor manufacturing system for bringing active equipment to an emergency stop.

Another object of the present invention is to provide, in a semiconductor manufacturing system designed based on SEMI E84, E23 or the like, a control device of the semiconductor manufacturing system for bringing active equipment to an emergency stop with a simple configuration.

A further object of the present invention is to provide, in a semiconductor manufacturing system designed based on SEMI E84, E23 or the like, a control device of the semiconductor manufacturing system for bringing active equipment to an emergency stop to ensure safety of an operator.

A still further object of the present invention is to provide, in a semiconductor manufacturing system designed based on SEMI E84, E23 or the like, a control device of the semiconductor manufacturing system for facilitating recovery of active equipment from an emergency stop.

The control device according to the present invention controls a semiconductor manufacturing system including semiconductor production equipment and transport equipment transporting wafers contained in a carrier to the semiconductor production equipment. The semiconductor production equipment includes a first control circuit which has a circuit for bringing the semiconductor production equipment to an emergency stop. The transport equipment includes a second control circuit which has a circuit for bringing the transport equipment to an emergency stop. The first and second control circuits are connected by a signal line transmitting a signal which, when turned off, causes the second control circuit to bring the transport equipment to the emergency stop. The control device includes a receiving circuit which is connected to the first control circuit and receives an emergency stop signal for bringing the transport equipment to an emergency stop, and a control circuit which, in response to reception of the emergency stop signal, inhibits an output of emergency stop designation to the first control circuit and controls the signal on the signal line to turn off.

When the receiving circuit receives the emergency stop signal for bringing the transport equipment to an emergency stop, the control circuit turns off the signal being transmitted via the signal line connecting the first and second control circuits from the first control circuit to the second control circuit for bringing the transport equipment to an emergency stop. With this signal turned off, the second control circuit brings the transport equipment to an emergency stop. At this time, the output of the designation causing an emergency stop of the semiconductor production equipment to the first control circuit is inhibited. As such, on the occurrence of an error such as collision of the carrier transported by the transport equipment with the semiconductor production equipment, the transport equipment is brought to an emergency stop, whereas an undesired emergency stop of the semiconductor production equipment is prevented. As a result, it is possible to provide, in a semiconductor manufacturing system designed based on SEMI E84, E23 or the like, a control device of the semiconductor manufacturing system for bringing the transport equipment as the active equipment to an emergency stop.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings. In the following description and the drawings, the same reference characters represent the same or corresponding portions having the same names and functions, and thus, detailed description thereof will not be repeated.

First Embodiment

Figure 2:
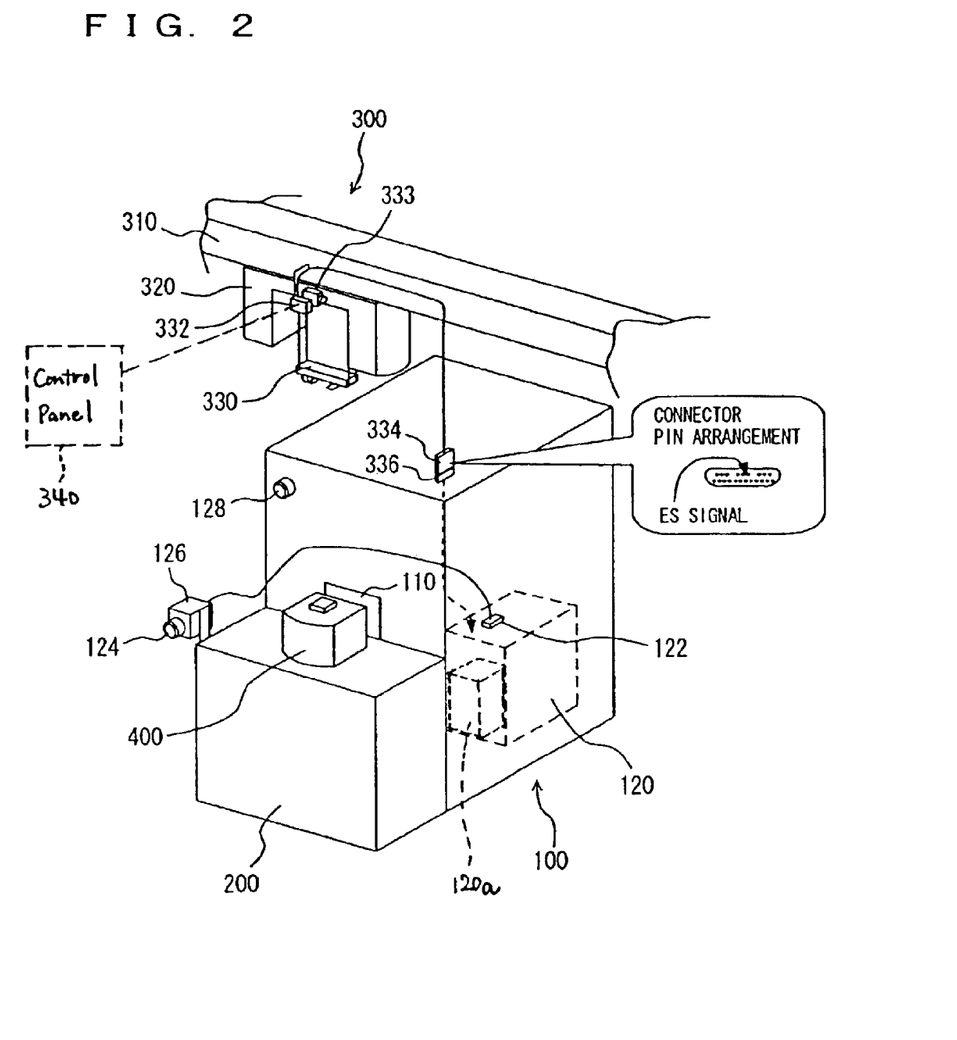
FIG. 2 is an external view of a semiconductor manufacturing system according to a first embodiment of the present invention.

The semiconductor manufacturing system according to the first embodiment is now described. Referring to FIG. 2, the semiconductor manufacturing system includes semiconductor production equipment 100 and an AMHS 300 which transports wafers contained in a carrier 400 to semiconductor production equipment 100. The carrier 400 transported by AMHS 300 is rested on a load port 200 provided in the proximity of a wafer in/out gate 110 of semiconductor production equipment 100.

Semiconductor production equipment 100 is controlled by a semiconductor production equipment control panel 120 having a terminal block 122. Semiconductor production equipment 100 is provided with an emergency stop button 128 to bring semiconductor production equipment 100 to an emergency stop. Further, semiconductor production equipment control panel 120 is connected with an ES button 124 provided in an ES button box 126. Semiconductor production equipment control panel 120 includes a controller 120a, in response to reception of an input from the ES button 124, for inhibiting an output of emergency stop designation to semiconductor production equipment 100 and for controlling the ES signal to be turned off.

AMHS 300 is formed of a vehicle 320 suspended from and running along a rail 310, and a hand 330 provided to the vehicle 320. Vehicle 320 having its hand 330 gripping carrier 400 runs along the rail 310. When the running vehicle 320 stops at a position of load port 200, hand 330 descends and rests the carrier 400 on load port 200. Wafers are taken out of the carrier 400 rested on load port 200, and are transferred via wafer in/out gate 110 to the inside of semiconductor production equipment 100. AMHS 300 is controlled by a control panel 340.

Connection between semiconductor production equipment control panel 120 and AMHS 300 is now described. An ES signal is transmitted from semiconductor production equipment control panel 120 via an optical parallel I/O receptacle 336 and optical parallel I/O connector 334 to an optical parallel I/O 332. The ES signal is then transmitted from optical parallel I/O 332 to a vehicle-side optical parallel I/O 333 provided on vehicle 320. When the ES signal is turned off, vehicle 320 is stopped urgently by its control device. The ES signal is a signal which is kept constantly on. When the ES signal output from semiconductor production equipment control panel 120 turns off, vehicle-side optical parallel I/O 332 detects turning off of the ES signal, and vehicle 320 is stopped or the motion of the hand 330 provided to vehicle 320 is stopped urgently by the control device.

ES button 124 corresponding to the ES signal is provided, e.g., in the proximity of load port 200. When semiconductor production equipment control panel 120 detects depression of ES button 124, it stops sending the ES signal via optical parallel I/O receptacle 336, optical parallel I/O connector 334, optical parallel I/O 332 and vehicle-side optical parallel I/O 333 to vehicle 320.

Figure 3:
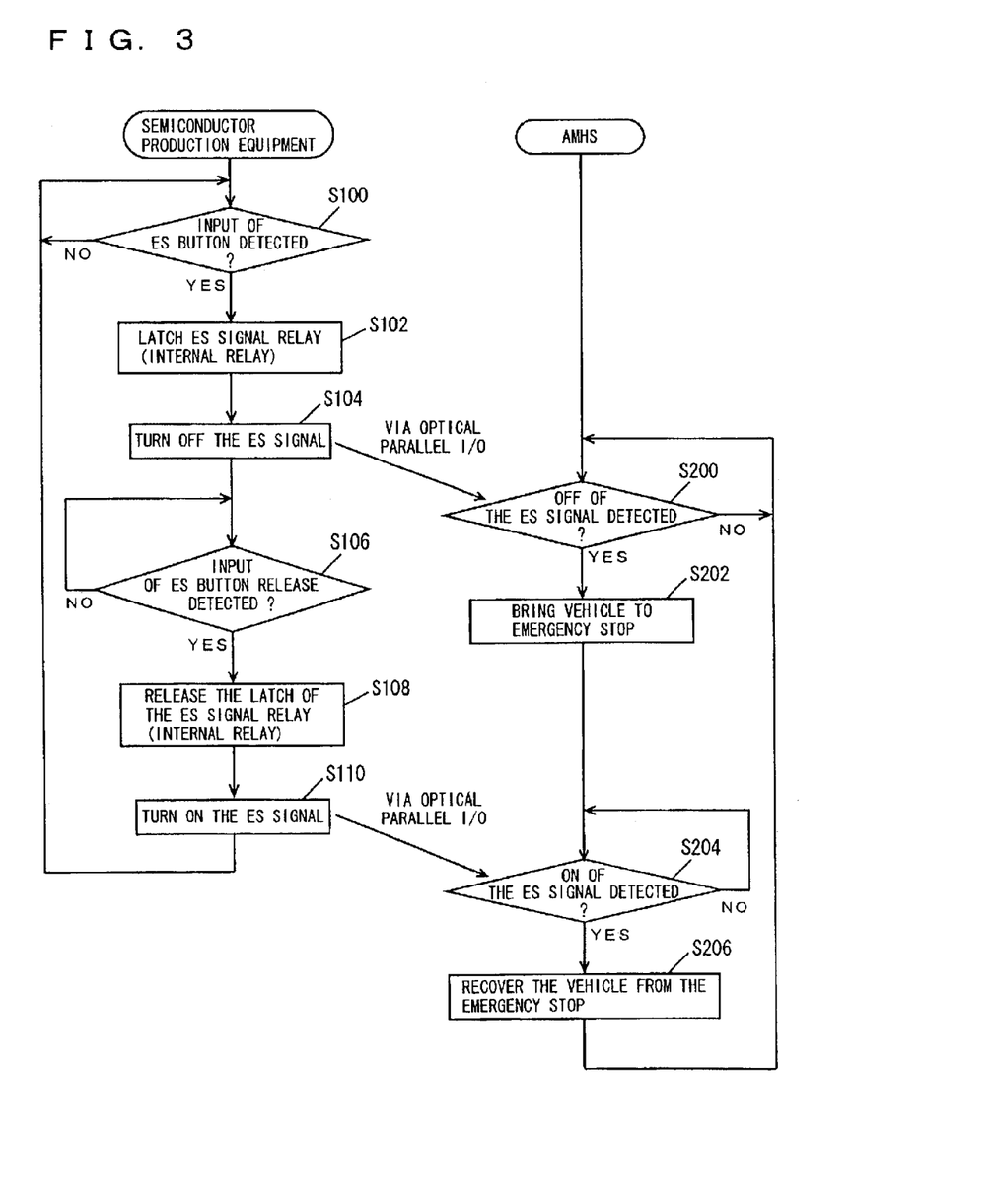
FIG. 3 is a flowchart illustrating how a program executed by the system shown in FIG. 2 is controlled.

Referring to FIG. 3, the control structure of the program executed by semiconductor production equipment 100 and AMHS 300 in the semiconductor manufacturing system according to the present embodiment is described.

In step (hereinafter, "S") 100, semiconductor production equipment 100 determines whether an input from ES button 124 has been detected. When the input from ES button 124 is detected (YES in S100), process goes to S102. If not (NO in S100), process returns to S100 and waits for an input from ES button 124.

In S102, semiconductor production equipment 100 latches the ES signal relay (internal relay). In S104, semiconductor production equipment 100 turns the ES signal off. At this time. controller 120a inhibits an output of emergency stop designation to semiconductor production equipment control panel 120.

In S106, semiconductor production equipment 100 determines whether an input of ES button release has been detected. The input is detected, e.g., when an ES reset button provided in addition to ES button 124 is depressed. Alternatively, ES button 124 may have a push-lock-turn-return type latch function. This kind of button is locked when pushed, and the lock is released when the button is turned. It is determined that the input of ES button release has been detected when the relevant button is turned to release the lock, instead of the ES reset button being depressed. When the input of ES button release is detected (YES in S106), process goes to S108. Otherwise (NO in S106), process returns to S106 to wait for the input of ES button release.

In S108, semiconductor production equipment 100 releases the latch of the ES signal relay (internal relay). In S 110, semiconductor production equipment 100 turns the ES signal on.

In S200, AMHS 300 determines whether turning off of the ES signal transmitted from semiconductor production equipment 100 via optical parallel I/O 332 has been detected. If the turning off of the ES signal is detected (YES in S200), process goes to S202. If not (NO in S200), process returns to S200 to wait for the ES signal transmitted from semiconductor production equipment 100 to turn off.

In S202, AMHS 300 brings vehicle 320 to an emergency stop. At this time, hand 330 is also brought to an emergency stop together with vehicle 320.

In S204, AMHS 300 determines whether turning on of the ES signal transmitted from semiconductor production equipment 100 has been detected. When the turning on of the ES signal is detected (YES in S204), process goes to S206. If not (NO in S204), process returns to S204 to wait for the ES signal transmitted from semiconductor production equipment 100 via optical parallel I/O 332 to turn on.

In S206, AMHS 300 causes vehicle 320 to recover from the emergency stop, so that vehicle 320 and hand 330 return to normal states and restart the operations.

Although the objects to be brought to the emergency stop are restricted to vehicle 320 and hand 330 in the flowchart shown in FIG. 3, the present invention is not limited thereto.

Figure 4:
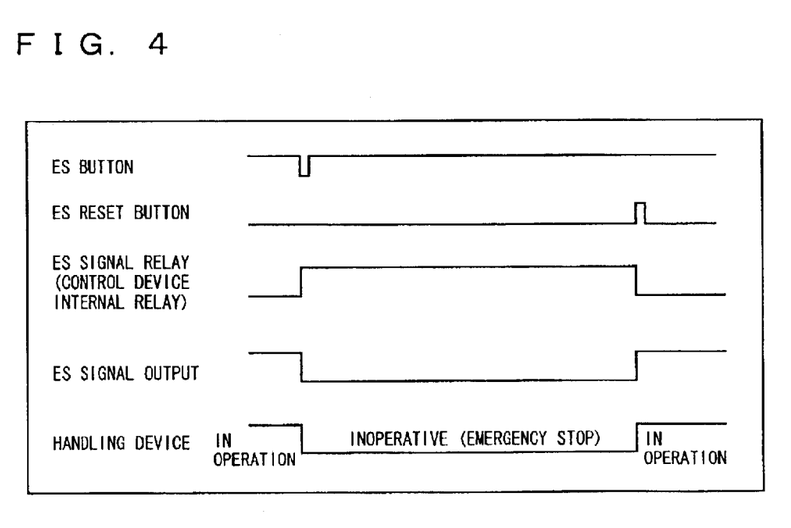
FIG. 4 is a timing chart of the system in FIG. 2.

An operation of the semiconductor manufacturing system according to the present embodiment based on the above-described structure and flowchart is now described. When ES button 124 provided in the proximity of semiconductor production equipment 100 is depressed by an operator (YES in S100), the ES signal relay being the internal relay of semiconductor production equipment 100 is latched (S102). The ES signal being transmitted from semiconductor production equipment 100 to AMHS 300 is turned off (S104). This state is shown in FIG. 4. That is, the ES signal relay is latched at the timing of depression of the ES button, and at the same time, the ES signal turns from on to off.

The ES signal is transmitted via optical parallel I/O 332 to AMHS 300. When AMHS 300 detects turning off of the ES signal (YES in S200), it brings vehicle 320 and hand 330 to an emergency stop (S202). At this time, as shown in FIG. 4, the handling device, AMHS 300, makes a transition from an operating state to an inoperative state in response to the falling of the ES signal.

After depression of ES button 124, when an operator working near semiconductor production equipment 100 wants AMHS 300 to restart the operation, he/she inputs ES button release (YES in S106). In response, the internally latched ES signal relay is released (S108), and the ES signal is turned from off to on (S110). The ES signal of the on state is transmitted via optical parallel I/O 332 to AMHS 300, and AMHS 300 detects the on state of the ES signal (YES in S204). Subsequently, vehicle 320 and hand 330 recover from the state of emergency stop (S206). At this time, as shown in FIG. 4, the internal ES signal relay is turned off and the ES signal is turned on at the timing of depression of the ES reset button. When the ES signal turns on, vehicle 320 and hand 330 change from an inoperative state to an operating state.

The controller 120a inhibits an output of emergency stop designation to control panel 120 of semiconductor production equipment 100 at the timing of depression of the ES button, so that semiconductor production equipment 100 is unaffected by depression of ES button 124. Thus, semiconductor production equipment 100 continues the manufacturing process of semiconductor wafers regardless of the state of ES button 124.

As described above, according to the semiconductor manufacturing system of the present embodiment, when an operator depresses the ES button in order to stop the active equipment AMHS, the ES signal relay attains an on state and the ES signal attains an off state, which states are maintained until the ES reset button is depressed. When the ES signal turns off, the active equipment, AMHS 300, is stopped urgently, as defined in SEMI E84. Accordingly, it is possible to bring the active equipment, the AMHS, to an emergency stop, while permitting the passive equipment, the semiconductor production equipment, to continue the operation.

Second Embodiment

Hereinafter, the semiconductor manufacturing system according to the second embodiment is described. In the following, detailed description of the same structures as in the semiconductor manufacturing system of the first embodiment will not be repeated.

Figure 5:
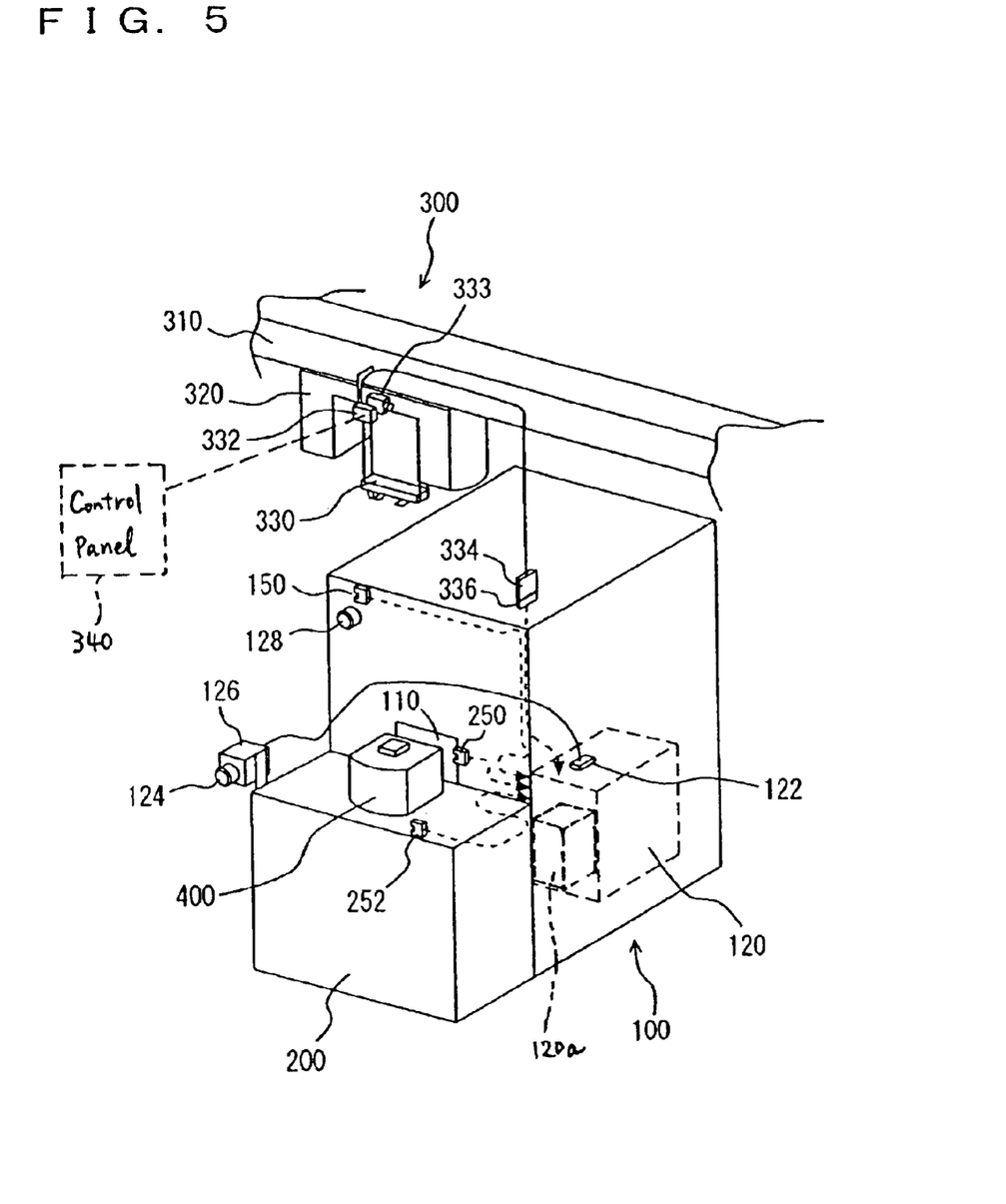
FIG. 5 is an external view of a semiconductor manufacturing system according to a second embodiment of the present invention.

Referring to FIG. 5, the semiconductor manufacturing system of the present embodiment includes, in addition to the configuration of the system according to the first embodiment, a semiconductor production equipment error detection sensor 150 which detects an error of semiconductor production equipment 100 itself, a wafer in/out gate error detection sensor 250 which detects an error associated with the in/out operation of wafers occurred in the proximity of wafer in/out gate 110, and a load port error detection sensor 252 which is placed in the proximity of load port 200 and detects an error associated with the operation of load port 200 itself. Signals from semiconductor production equipment error detection sensor 150, wafer in/out gate error detection sensor 250 and load port error detection sensor 252 are all input to semiconductor production equipment control panel 120. The signals are input from the sensors only in the case where an emergency stop of the active equipment, AMHS 300, is required while an emergency stop of the passive equipment, semiconductor production equipment 100, is undesired.

Figure 6:
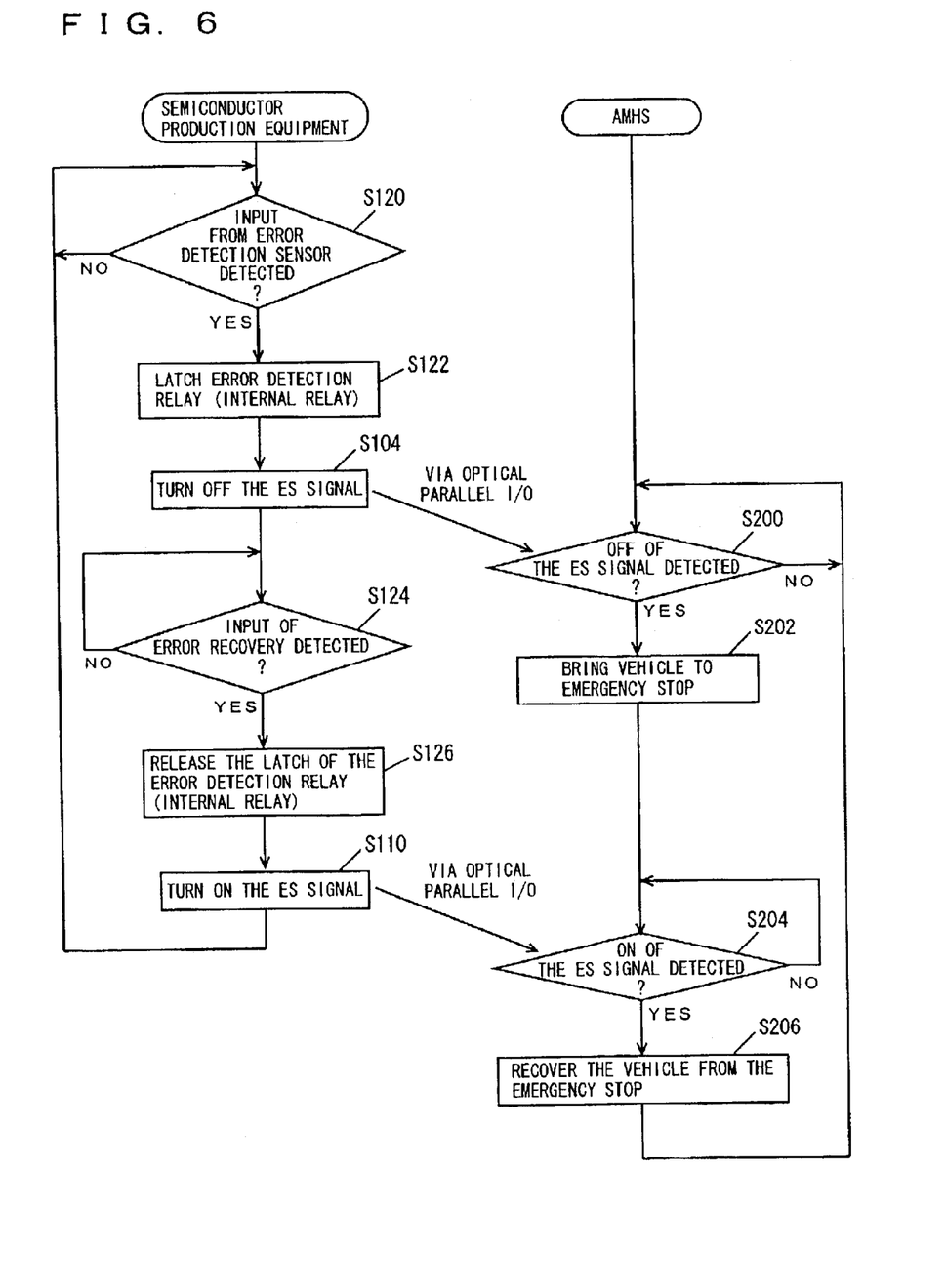
FIG. 6 is a flowchart illustrating how a program executed by the system shown in FIG. 5 is controlled.

Referring to FIG. 6, the control structure of the program being executed by semiconductor production equipment 100 and AMHS 300 of the semiconductor manufacturing system according to the present embodiment is explained. In the flowchart shown in FIG. 6, the same step numbers as in the flowchart of FIG. 3 represent the same process steps with the same process contents. Thus, detailed description thereof is not repeated here.

In S120, semiconductor production equipment 100 determines whether an input from any error detection sensor has been detected. This determination is made according to whether an error detection signal has been input from any of semiconductor production equipment error detection sensor 150, wafer in/out gate error detection sensor 250 and load port error detection sensor 252. When the input of the error detection signal is detected (YES in S120), process goes to S122. Otherwise (NO in S120), process returns to S120 to wait for an input from an error detection sensor. In S122, semiconductor production equipment 100 latches the error detection relay (internal relay).

In S124, semiconductor production equipment 100 determines whether an input of error recovery has been detected. When the input of error recovery is detected (YES in S124), process goes to S126. Otherwise (NO in S124), process returns to S124 to wait for an input of error recovery. In S126, semiconductor production equipment 100 releases the latch of the error detection relay (internal relay).

An operation of the semiconductor manufacturing system of the present embodiment based on the above-described structure and flowchart is now described.

Occurrence of an error in semiconductor production equipment 100 requiring stoppage of AMHS 300 is detected by semiconductor production equipment error detection sensor 150. Occurrence of an error associated with the in/out operation of wafers is detected by wafer in/out gate error detection sensor 250 provided inside the wafer in/out gate. Occurrence of an error associated with the operation of load port 200 itself is detected by load port error detection sensor 252. When an input from any error detection sensor is detected (YES in S120), the internal, error detection relay is latched (S122).

Figure 7:
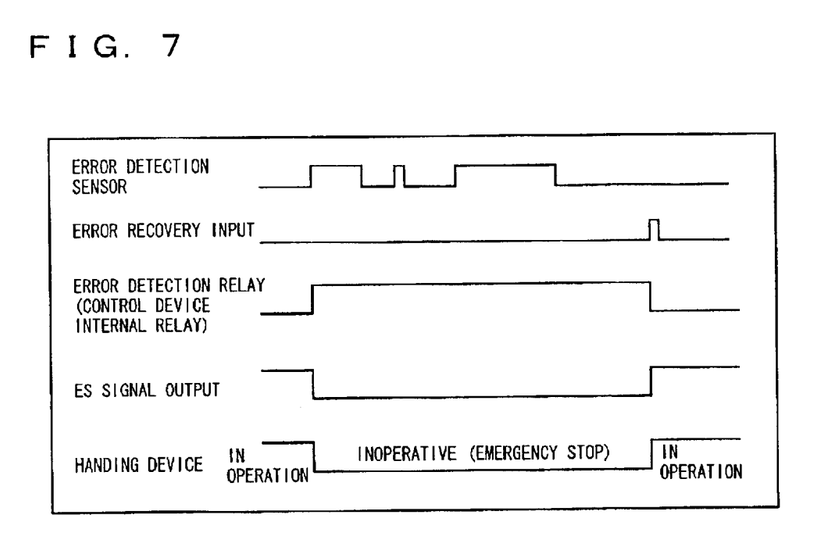
FIG. 7 is a timing chart of the system in FIG. 5.

At the same time, the ES signal is turned off (S104). This situation is explained in conjunction with the timing chart in FIG. 7. Each error detection sensor repeatedly turns on and off by chattering, for example. The internal, error detection relay rises and is latched in response to the first rising of the error detection sensor, and the ES signal is turned off at the same time. The turning off of the ES signal is detected by AMHS 300 (YES in S200), and vehicle 320 and hand 330 are brought to an emergency stop (S202).

As described above, according to the semiconductor manufacturing system of the present embodiment, in addition to the ES button as in the semiconductor manufacturing system of the first embodiment, various sensors are provided which detect the situation requiring an emergency stop of the AMHS. When an emergency situation is detected by any sensor, the ES signal being transmitted via optical parallel I/O to the AMHS is turned off. When the ES signal turns off, the AMHS stops its operation urgently. As such, in the semiconductor manufacturing system of the present embodiment, in addition to the ES button as in the first embodiment, sensors for bringing the active equipment, or the AMHS, to an emergency stop are provided, and the ES signal is configured to turn off in response to an input from any of the sensors. Accordingly, the active equipment, or the AMHS, can be brought to an emergency stop by turning off the ES signal, not only by depression of the ES button by an operator, but also by detection of an error by a sensor.

Third Embodiment

Hereinafter, the semiconductor manufacturing system according to the third embodiment is described. In the configuration of the semiconductor manufacturing system of the present embodiment, the same structures as in the first and/or second embodiments having the identical functions are denoted by the same reference characters, and detailed description thereof is not repeated here.

Figure 8:
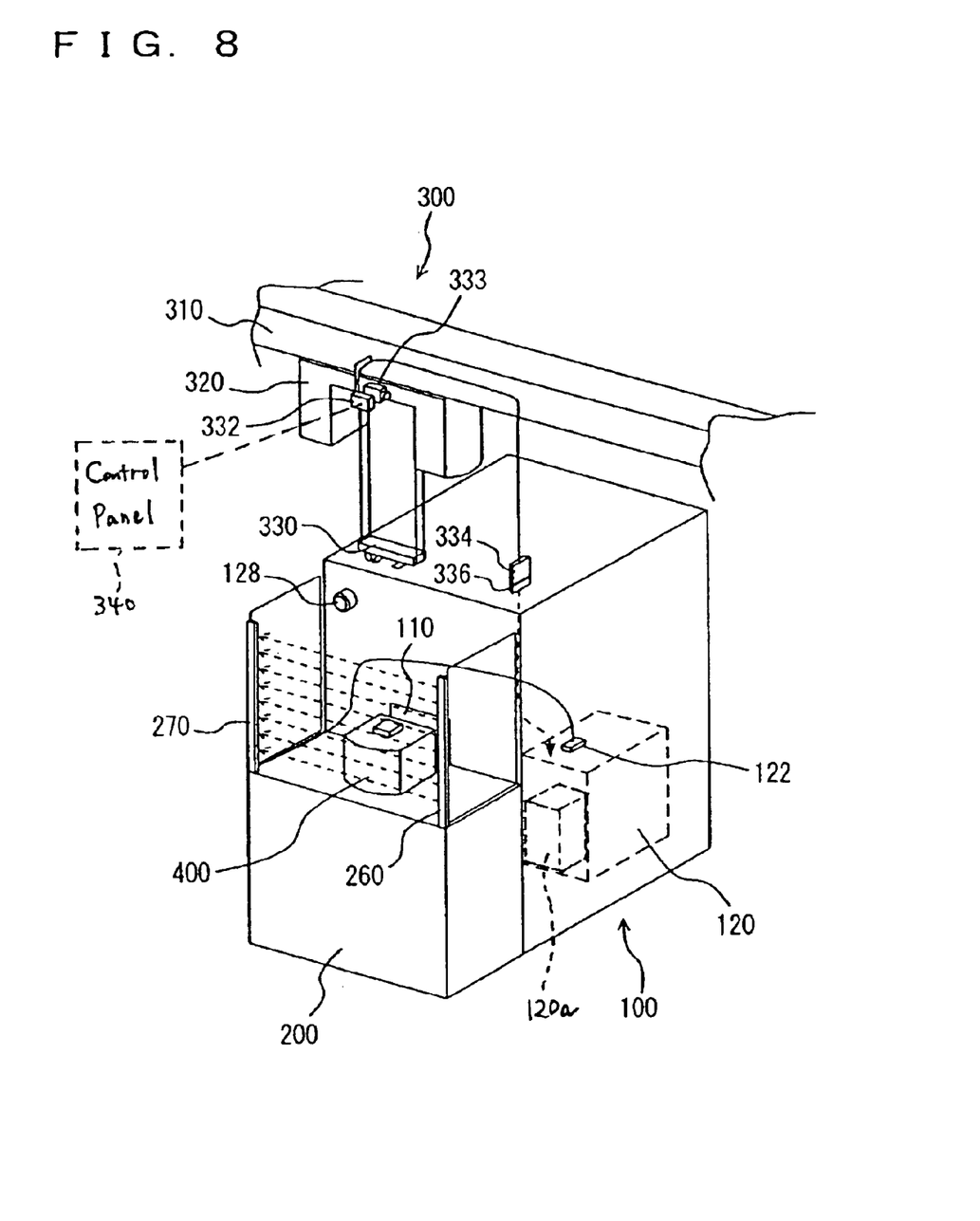
FIG. 8 is an external view of a semiconductor manufacturing system according to a third embodiment of the present invention.

Referring to FIG. 8, the semiconductor manufacturing system of the present embodiment includes a photo transmitting side beam sensor 260 and a photo receiving side beam sensor 270 provided to the load port 200 on which carrier 400 is rested. Beam sensors 260 and 270 detect an obstacle to carrier 400 present on load port 200 when the light emitted from photo transmitting side beam sensor 260 is blocked by the obstacle. Detection signals from photo transmitting side beam sensor 260 and photo receiving side beam sensor 270 are applied to semiconductor production equipment control panel 120. Beam sensors 260 and 270 are formed of N photo transmitting elements and N photo receiving elements, respectively.

The control structure of the program being executed in the semiconductor manufacturing system of the present embodiment is identical to the control structure (as in the flowchart of FIG. 6) of the program being executed in the semiconductor manufacturing system of the second embodiment described above. Thus, detailed description thereof is not repeated here.

Figure 9:
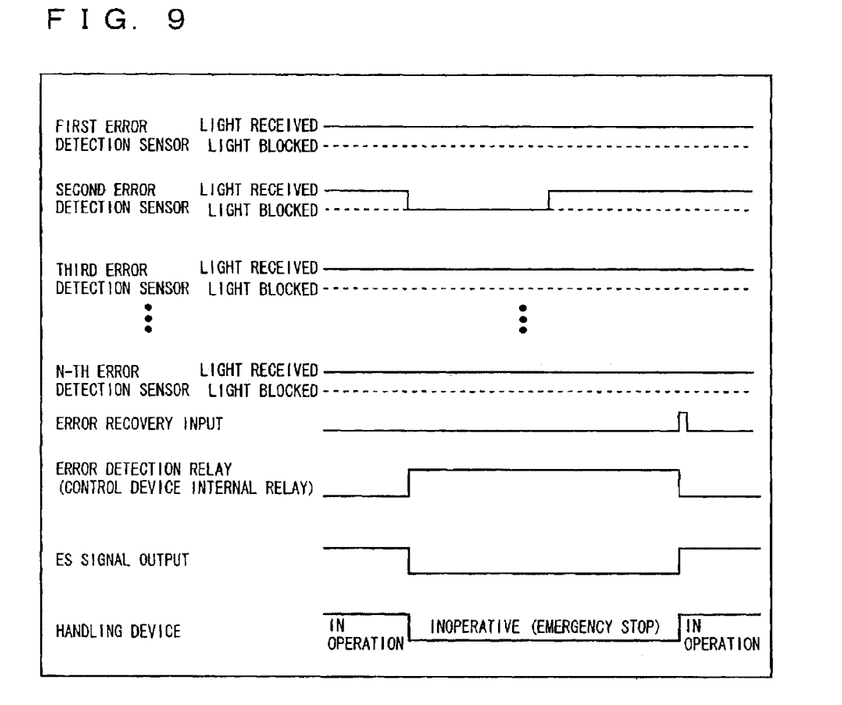
FIG. 9 is a timing chart of the system shown in FIG. 8.

The operation of the semiconductor manufacturing system of the present embodiment based on the above-described structure and flowchart is now explained. When any of the N error detection sensors formed of photo transmitting side beam sensor 260 and photo receiving side beam sensor 270 detects a light-blocked state, the internal, error detection relay is latched, as shown in FIG. 9. In the case of FIG. 9, the error detection relay is latched when the second error detection sensor among the N beam sensors detected the light-blocked state, and at the same time, the ES signal is turned from on to off. In response to the turning off of the ES signal, vehicle 320 and hand 330 each become inoperative.

As described above, according to the semiconductor manufacturing system of the present embodiment, the beam sensors as the combinations of a plurality of error detection sensors detect an obstacle impeding the movement of carriers, and bring the active equipment, or the AMHS, to an emergency stop.

Fourth Embodiment

Figure 10:
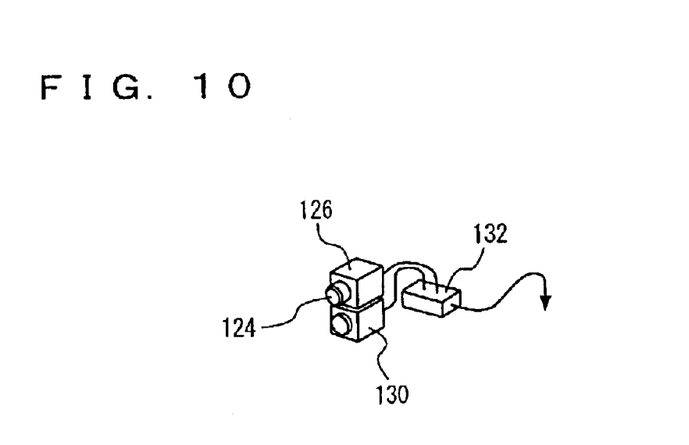
FIG. 10 is an external view of an ES button according to a fourth embodiment of the present invention.

Referring to FIG. 10, the structure of ES button in the semiconductor manufacturing system of the fourth embodiment is explained. As shown in FIG. 10, a reset button 130 and a latch circuit 132 are provided in addition to ES button 124. In the above-described embodiments, the latch was performed by the internal relay of semiconductor production equipment 100. In the semiconductor manufacturing system of the present embodiment, the ES button is latched by the external latch circuit 132.

Fifth Embodiment

The ES button according to the fifth embodiment is now described. It is assumed that there are five setup positions for carriers 400 on the load port 200 in the semiconductor manufacturing system of the present embodiment.

Figure 11:
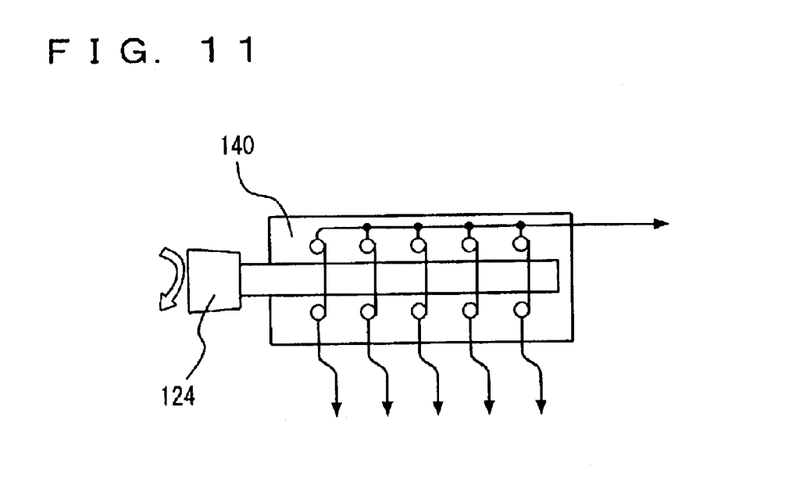
FIG. 11 is a cross sectional view of an ES button according to a fifth embodiment of the present invention.

As shown in FIG. 11, a multiple-contact box 140 is provided for semiconductor production equipment 100. Multiple-contact box 140 comprises, e.g., five B contacts, and is turned off when ES button 124 is depressed. The outputs from the B contacts of multiple-contact box 140 are connected to respective terminals of terminal block 122. With this configuration, it is unnecessary to provide a large number of ES buttons corresponding to the respective setup positions of carriers 400 provided on load port 200. The signals may be divided using a relay, instead of the multiple-contact box.

Sixth Embodiment

Figure 12:
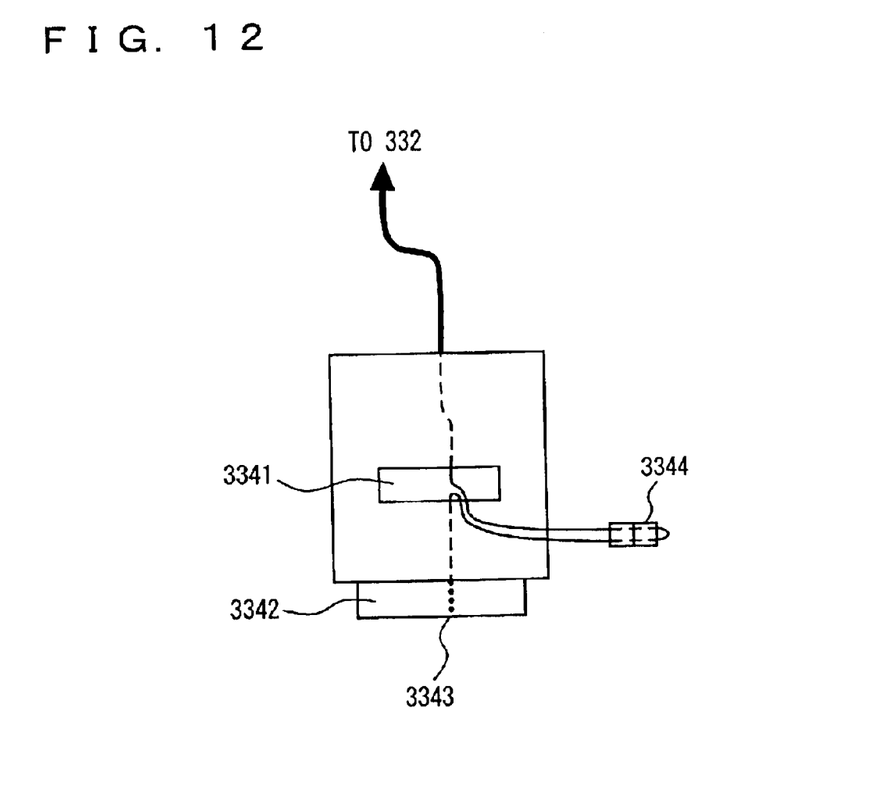
FIG. 12 is an external view of an optical parallel I/O connector according to a sixth embodiment of the present invention.

The optical parallel I/O connector 334 in the semiconductor manufacturing system of the sixth embodiment is now described. In the present embodiment, terminal block 122 (in the form of an ES connector 3344) is provided to the optical parallel I/O connector 334.

As shown in FIG. 12, a cable drawn from optical parallel I/O connector 334 is connected to an optical parallel I/O 332. A connect portion 3342 within the connector is connected to optical parallel I/O receptacle 336. Connect pins 3343 within the connector are the ES signal pins. There is an opening 3341 provided in optical parallel I/O connector 334, from which a signal line is externally drawn to connect to an ES connector 3344. ES connector 3344 is connected to semiconductor production equipment control panel 120. Although terminal block 122 has been mounted to semiconductor production equipment control panel 120 in the foregoing embodiments, not limited thereto, it may be mounted on top of, or outside of, semiconductor production equipment 100, or it may be mounted to load port 200. In the present embodiment, instead of mounting a terminal block to a connector, ES connector 3344 is provided to optical parallel I/O connector 334, since the optical parallel I/O connector 334 is too small to mount a terminal block thereon.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A control device of a semiconductor manufacturing system including semiconductor production equipment and transport equipment transporting wafers contained in a carrier to the semiconductor production equipment, said semiconductor production equipment including a first controller for bringing said semiconductor production equipment to an emergency stop, said transport equipment including a second controller for bringing said transport equipment to an emergency stop, said first and second controllers being connected by a signal line for transmitting a signal from the first controller to the second controller, said second controller configured to bring said transport equipment to the emergency stop when said signal is in an off state, said control device comprising:

receiving means for receiving an emergency stop signal for bringing said transport equipment to an emergency stop; and control means, in response to reception of said emergency stop signal by said receiving means, for inhibiting an output of emergency stop designation to said first control circuit, wherein said first controller is configured to turn off the signal in response to reception of said emergency stop signal by said receiving means.

2. The control device according to claim 1, further comprising input means connected to said receiving means for inputting said emergency stop signal.

3. The control device according to claim 1, further comprising detecting means for outputting said emergency stop signal to said receiving means in response to detection of an occurrence of interference between said semiconductor production equipment and said transport equipment.

4. The control device according to claim 1, further comprising:

reset signal receiving means, connected to said first controller, for receiving a reset signal for releasing the emergency stop of said transport equipment;

wherein said first controller is configured to turn on the signal on said signal line.

5. The control device according to claim 4, further comprising:

latch means connected to said receiving means for latching said emergency stop signal; and latch release means for releasing said latch in response to reception of said reset signal.

* * * * *

UNITED STATES PATENT AND TRADEMARK OFFICE
CERTIFICATE OF CORRECTION

PATENT NO. : 6,788,992 B2
DATED : September 7, 2004
INVENTOR(S) : Akira Ono It is certified that error appears in the above-identified patent and that said Letters Patent is hereby corrected as shown below:

Column 10,
Line 7, change "first control circuit, wherein" to -- first controller, wherein --.

Signed and Sealed this

Twenty-sixth Day of April, 2005

JON W. DUDAS
*Director of the United States Patent and Trademark Office*